(12) United States Patent
Kim et al.

(10) Patent No.: US 7,393,581 B2
(45) Date of Patent: Jul. 1, 2008

(54) PLASTIC SUBSTRATE HAVING MULTI-LAYER STRUCTURE AND METHOD FOR PREPARING THE SAME

(75) Inventors: Dong-Ryul Kim, Daejeon (KR); Gi-Cheul Kim, Daejeon (KR); Sang-Hyun Park, Daejeon (KR)

(73) Assignee: LG Chem, Ltd., Seoul (KR)

( * ) Notice: Subject to any disclaimer, the term of this patent is extended or adjusted under 35 U.S.C. 154(b) by 451 days.

(21) Appl. No.: 11/049,939

(22) Filed: Feb. 4, 2005

(65) Prior Publication Data

US 2005/0175831 A1    Aug. 11, 2005

(30) Foreign Application Priority Data

Feb. 6, 2004    (KR) .................... 10-2004-0007909
Feb. 4, 2005    (KR) .................... 10-2005-0010375

(51) Int. Cl.
*B32B 7/02*    (2006.01)
*B32B 27/20*   (2006.01)

(52) U.S. Cl. .................... 428/216; 428/336; 428/451

(58) Field of Classification Search .................. 428/451, 428/216, 336
See application file for complete search history.

(56) References Cited

U.S. PATENT DOCUMENTS 5,736,207 A * 4/1998 Walther et al. ............. 428/34.7
6,322,860 B1 11/2001 Stein et al.
6,465,953 B1 10/2002 Duggal
6,503,634 B1  1/2003 Utz et al.

FOREIGN PATENT DOCUMENTS

KR    10-1999-0045093    6/1999

* cited by examiner

*Primary Examiner*—D. S. Nakarani
(74) *Attorney, Agent, or Firm*—McKenna Long & Aldridge LLP

(57) ABSTRACT

The present invention relates to a plastic substrate having a multi-layer structure and a method for preparing the same. The plastic substrate of the present invention comprises plastic films attached to each other, and a first buffering layer of an organic-inorganic hybrid, a layer of gas barrier, and a second buffering layer of an organic-inorganic hybrid which are stacked on both sides of the plastic films in an orderly manner, each layer forming a symmetrical arrangement centering around the plastic films.

Because the plastic substrate of the present invention has a small coefficient of thermal expansion, excellent dimensional stability, and superior gas barrier properties, it can replace the brittle and heavy glass substrate in display devices. Also, it can be used for a variety of packaging or container materials in applications requiring superior gas barrier properties.

6 Claims, 3 Drawing Sheets

PLASTIC SUBSTRATE HAVING MULTI-LAYER STRUCTURE AND METHOD FOR PREPARING THE SAME

CROSS-REFERENCE TO RELATED APPLICATION

This application claims priority of Korean Patent Application Nos. 10-2004-0007909 filed on Feb. 6, 2004 and 10-10-2005-0010375 filed on Feb. 4, 2005 in the Korean Intellectual Property Office, the entire disclosure of which are incorporated herein by reference.

BACKGROUND OF THE INVENTION (a) Field of the Invention

The present invention relates to a plastic substrate having a multi-layer structure with a small coefficient of thermal expansion, excellent dimensional stability, and superior gas barrier properties and a method for preparing the same.

(b) Description of the Related Art

Although glass plates used for display devices, picture frames, craftwork, containers, etc. are advantageous in that they have a small coefficient of linear expansion, superior gas barrier properties, high transparency, good surface flatness, excellent heat resistance and chemical resistance, etc., they tend to break easily and be heavy because of their high density.

Recently, as liquid crystal displays, organic light emitting devices, and electronic paper are arousing a growing interest, research on replacing the glass substrates used in such devices with plastic counterparts is gaining momentum. The plastic substrate is advantageous over the glass plate in terms of weight and ease of design. Also, because it is impact-resistant, an economic advantage may be attained from continuous manufacturing.

For a plastic substrate to be used in a display device, it should have a glass transition temperature high enough to endure the transistor processing temperature and the transparent electrode deposition temperature, oxygen and water vapor barrier properties so as to prevent aging of liquid crystals and organic light emitting materials, a small coefficient of thermal expansion and good dimensional stability so as to prevent deformation of the plate due to change of the processing temperature, mechanical strength comparable to that of the conventional glass plate, chemical resistance sufficient for enduring the etching process, high transparency, low birefringence, good surface scratch resistance, etc.

However, because a single polymer composite film (polymer film or polymer-inorganic material composite film) that satisfies all the requirements does not exist, several layers of functional coats are applied on a polymer film to fulfill them. Typical coating layers are an organic flattening layer for reducing surface defects and offering flatness, an inorganic barrier layer for blocking gaseous materials such as oxygen and water vapor, and an organic or organic-inorganic hard coating layer for offering surface scratch resistance. The conventional plastic substrates having a multi-layer structure are manufactured by coating an inorganic gas barrier layer on a plastic film and coating a hard coating layer on the gas barrier layer. In such a multi-layer structure, deformation of the plastic film or cracking or peeling of the inorganic layer may occur because of the difference of coefficients of linear expansion of the plastic film and the gas barrier layer. Accordingly, design of an appropriate multi-layer structure capable of minimizing stress at the interface of each layer and adhesion of each coating layer are very important.

Vitex Systems of the U.S. developed a substrate having a superior gas barrier property by obtaining an organic-inorganic multi-layer structure of several layers by forming a thin monomer film on a plastic film, polymerizing the monomer by illuminating UV (solidified organic layer), and forming a thin inorganic layer thereon by sputtering. Although a substrate having a superior gas barrier property can be obtained with this method, the requirement of a low coefficient of linear expansion, which is needed for a display, has not been satisfied, and a solution method for the problem has not yet been suggested.

U.S. Pat. No. 6,465,953 disclosed a method of dispersing getter particles capable of reacting with oxygen and water vapor on a plastic film to use for an organic light emitting device which is sensitive to oxygen and water vapor. The getter particles should have a particle size smaller than the characteristic wavelength of the emitted light, and should be dispersed uniformly so that the emitted light can transmit to the substrate without being scattered. This method is intended to minimize inflow of oxygen and water vapor by coating a gas barrier layer comprising an inorganic material on a plastic film. However, it is difficult to uniformly distribute nano particles having a particle size ranging from 100 to 200 nm, and the plastic film should be thick enough to comprise a lot of getter particles capable of reacting with oxygen and water vapor. Also, because the inorganic gas barrier layer is directly coated on the plastic film, the gas barrier layer tends to crack or peel off with changes in temperature.

U.S. Pat. No. 6,322,860 disclosed a plastic substrate for electronic display applications that was manufactured by coating a crosslinkable coating composition (comprising a polymer selected from the group consisting of polyfunctional acrylate monomers or oligomers, alkoxysilanes, etc. and a mixture thereof) on one or both sides of a polyglutarimide sheet having a thickness of no more than 1 mm, which has been prepared by extrusion, and photocuring or thermally curing it to form a crosslinked coating, and coating a gas barrier layer on the crosslinked coating and then coating another crosslinked coating on the barrier layer, if necessary. In specific cases, transmission rate of oxygen and water vapor was small enough to be used for a liquid crystal display. However, a small coefficient of thermal expansion and superior dimensional stability, which are required to replace the glass substrate, were not obtained.

U.S. Pat. No. 6,503,634 disclosed a multi-layer substrate manufactured by coating an organic-inorganic hybrid (OR-MOCER) and silicon oxide on a plastic film or between two sheets of plastic films. The resultant film showed an oxygen transmission rate of no more than $1/30$ and a water vapor transmission rate of no more than $1/40$, compared with those before coating. Although this film can be used in packaging because of significantly reduced oxygen and water vapor transmission rate, there was no mention about improvement in the coefficient of thermal expansion or dimensional stability.

SUMMARY OF THE INVENTION

It is an object of the present invention to provide a plastic substrate having a multi-layer structure, which has a small coefficient of thermal expansion, excellent dimensional stability, and superior gas barrier properties, and thus is capable of replacing the brittle and heavy glass plate.

It is another object of the present invention to provide a method for preparing a plastic substrate having a multi-layer structure which can be used for a display device and a variety of packaging and container materials requiring superior gas barrier properties.

To attain the objects, the present invention provides a plastic substrate having a multi-layer structure, comprising:

plastic films attached to each other, and a first buffering layer of an organic-inorganic hybrid, a layer of gas barrier, and a second buffering layer of an organic-inorganic hybrid which are stacked on both sides of the plastic films in an orderly manner, each layer forming a symmetrical arrangement centering around the plastic films.

The present invention also provides a method for preparing a plastic substrate having a multi-layer structure comprising the steps of:

a) forming a first organic-inorganic hybrid buffer layer on one side of a plastic film by coating a buffer composition in the sol state thereon and curing it;

b) forming a gas barrier layer on the first organic-inorganic hybrid layer by coating an inorganic material thereon;

c) forming a second organic-inorganic hybrid buffer layer on the gas barrier layer by coating the buffer composition of the step a) and curing it to prepare a multi-layer film;

d) preparing another multi-layer film having the same structure as that obtained in the step c); and e) attaching the plastic film of the step c) and the step d), so that the sides with no multi-layer film contact each other.

DETAILED DESCRIPTION OF THE PREFERRED EMBODIMENTS

Hereunder is given a detailed description of the present invention.

The present invention is characterized by a plastic substrate having a small coefficient of linear expansion and superior dimensional stability and gas barrier properties, thereby being capable of replacing the glass substrate of a display device, etc., and a method for preparing the same.

In the plastic substrate of the present invention, an organic-inorganic hybrid buffer layer is positioned between plastic films and a gas barrier layer and on the gas barrier layer to minimize a difference of the coefficient of thermal expansion of each layer and improve the adhesion thereof.

The plastic substrate of the present invention is characterized by symmetrical attached structure comprising various layers. If any one layer in the structure is not, the function of the substrate can not be manifested. Thus, the plastic substrates of the present invention comprise essentially symmetrical various layers as follows.

Because the plastic substrate of the present invention has a symmetrical structure, it is not bent or deformed as the temperature changes.

According to the present invention, a plastic substrate having good gas barrier properties, a small coefficient of thermal expansion and excellent dimensional stability can be prepared easily by simply attaching two plastic films using inexpensive equipment.

The plastic substrate of the present invention will be described more fully hereinafter with reference to the accompanying drawings, in which preferred embodiments of the invention are shown.

Figure 1:
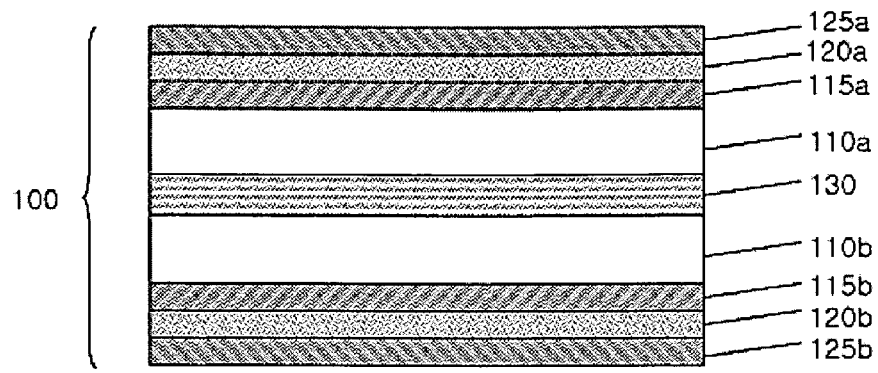
FIG. 1 shows the cross-section of the plastic substrate having a multi-layer structure according to the present invention.
Figure 2:
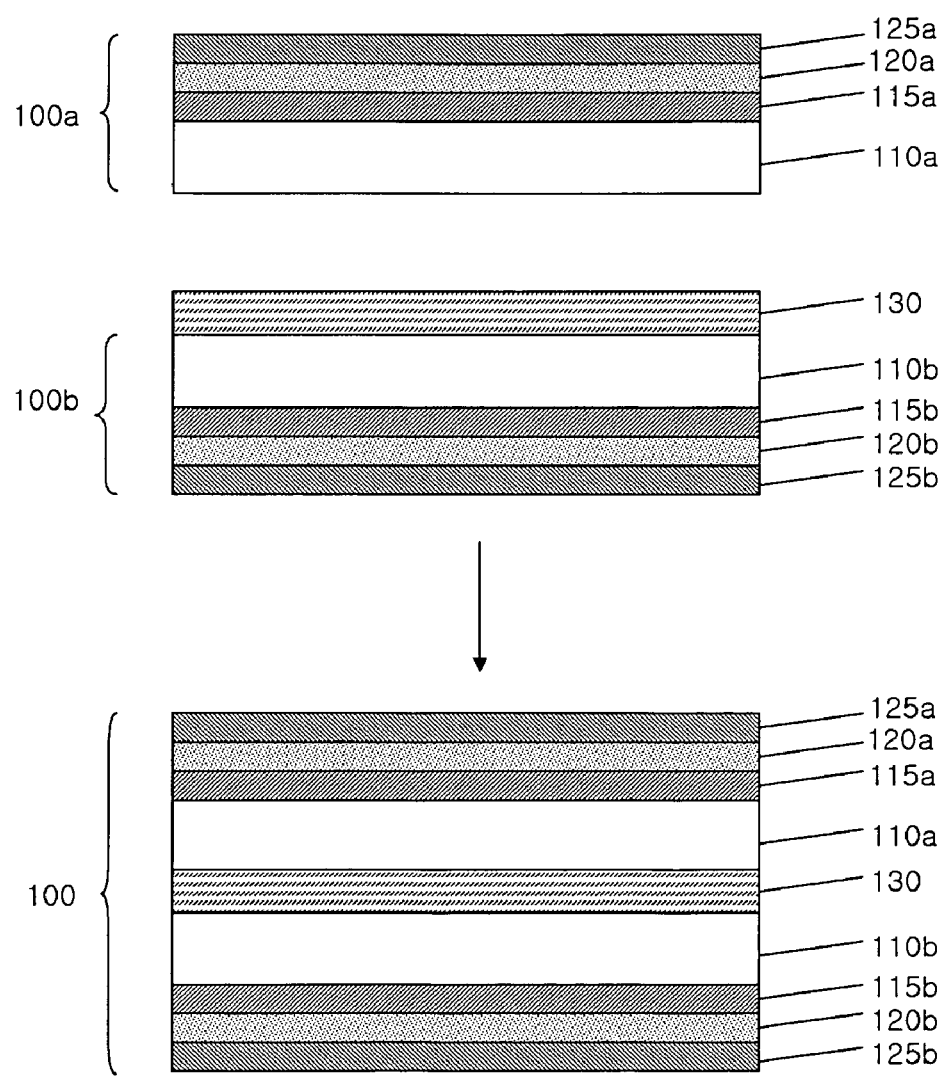
FIG. 2 shows a process for preparing the plastic substrate having a multi-layer structure according to the present invention.

The plastic substrate of the present invention has the structure shown in FIG. 1, and a process for preparing it is shown in FIG. 2.

The plastic substrate of the present invention has a multi-layer structure of two plastic film layers, two gas barrier layers and four organic-inorganic hybrid buffer layers.

As seen in FIGS. 1 and 2, the plastic substrate 100 of the present invention comprises attached plastic films 110a, 110b, and first organic-inorganic hybrid buffer layers 115a, 115b, gas barrier layers 120a, 120b, and second organic-inorganic hybrid buffer layers 125a, 125b which are stacked on both sides of the plastic films in an orderly manner, each layer forming a symmetrical arrangement centering around the plastic films. In FIGS. 1 and 2, the plastic substrate 100 refers to the combination of symmetric layers attached to the side of the plastic films of each of the multi-layer films 100a, 100b that are attached to each other centered on an attaching layer 130.

The first organic-inorganic hybrid buffer layer reduces a difference in the coefficients of thermal expansion of the plastic films and the gas barrier layer. Also, an adhesion of the plastic films to the gas barrier layer can be improved by adjusting compositions of the organic and inorganic constituents. In addition, it can increase adhesion to the gas barrier layer and minimize surface defects by flattening the surface of the plastic films.

The gas barrier layer is a dense inorganic material layer having a small coefficient of linear expansion and that blocks such gasses as oxygen and water vapor.

The second organic-inorganic hybrid buffer layer prevents cracking of the gas barrier layer, as well as further improving gas barrier properties by filling defects of the gas barrier layer. In addition, it can lower electrical resistance through its superior flattening ability, when forming a transparent conducting film.

The first organic-inorganic hybrid buffer layer and the second organic-inorganic hybrid buffer layer have the effects by preparing from partial hydrolysis of a buffer composition comprising the organic silane and the metal alkoxide.

The plastic films used in the present invention may be selected from the group consisting of a homopolymer, a polymer blend, and a polymer composite including organic or inorganic additives. When the plastic substrate of the present invention is used for a liquid crystal display device, a polymer having good heat resistance should be used because the manufacturing processes of thin-film transistors and transparent electrodes involves high temperature of 200° C. or above. Examples of such polymers are polynorbornene, aromatic fullerene polyester, polyethersulfone, bisphenol A polysulfone, polyimide, etc. As research on reducing the temperature of the substrate manufacturing process to about 150° C. proceeds, it has become possible to use such polymer such as polyethylene terephthalate, polyethylene naphthalene, polyarylate, polycarbonate, cyclic olefin copolymer, etc.

Also, a plastic film obtained by dispersing nano particles on a polymer can be used. A typical example of such a polymer composite material is the polymer-clay nanocomposite, which is advantageous in improving mechanical properties, heat resistance, gas barrier properties, dimensional stability, etc. because of the small particle size and large aspect ratio of the clay. In order to improve the above properties, it is important to disperse the platelets with the clay removed in a layered structure uniformly on a polymer matrix, and the material satisfying these conditions is the polymer-clay nanocomposite. Examples of the polymer-clay nanocomposite that can be used for the polymer-clay composite are polystyrene, polymethacrylate, polyethylene terephthalate, polyethylene naphthalene, polyarylate, polycarbonate, cyclic olefin copolymer, polynorbornene, aromatic fullerene polyester, polyethersulfone, polyimide, epoxy resin, polyfunctional acrylate, etc. For the clay, laponite, montmorillonite, magadite, etc. may be used.

The plastic film in the plastic substrate of the present invention has a film or sheet form having a thickness of 10 to 1,000 microns (μm). The plastic films can be prepared by solution casting or film extrusion. It is preferred to anneal the prepared polymer substrate for several seconds to several minutes at a temperature near the glass transition temperature in order to minimize deformation by temperature change. After annealing, a primer may be coated on the surface of the plastic film or surface treatment using corona, oxygen, or carbon dioxide plasma, and UV-ozone or reactive gas ion beams, etc. may be performed in order to improve coating characteristics or adhesion.

The plastic substrate of the present invention is prepared as follows. A buffer composition in the sol state is coated on one side of plastic films and cured to form a first organic-inorganic hybrid buffer layer. Then, an inorganic material is deposition coated on the first organic-inorganic hybrid buffer layer to form a gas barrier layer. Next, another buffer composition is coated and cured to form a second organic-inorganic hybrid buffer layer. As a result, a multi-layer film is obtained. Another multi-layer film is prepared by following the same process. Then, the two multi-layer films are attached so that the sides of the plastic films on which the multi-layer films are not formed are adjacent to each other.

The first organic-inorganic hybrid buffer layer can be obtained by partly hydrolyzing a buffer composition to form a sol-state solution, coating it on the plastic films, and curing the substrate. The coating may be performed by spin coating, roll coating, bar coating, dip coating, gravure coating, spray coating, etc. The curing may be performed by thermal curing, UV curing, IR curing, high frequency heat treatment, etc.

After curing, the organic-inorganic hybrid buffer layer has a thickness of 0.5-20 microns (μm), preferably 2-10 μm, and more preferably 1-5 μm.

The buffer composition for preparing the organic-inorganic hybrid buffer layer comprises an organic silane and a metal alkoxide. If necessary, it may further comprise an adequate additive, a solvent, and a polymerization catalyst.

The organic silane may be at least one selected from the group consisting of the compounds represented by Chemical Formula 1 below. When one kind of compound is used, the organic silane compound should be capable of crosslinking.

$$(R^1)_m\text{—Si—}X_{(4-m)} \tag{1}$$

where X, which may be identical or different, is hydrogen, halogen, $C_{1-12}$ alkoxy, acyloxy, alkylcarbonyl, alkoxycarbonyl, or $-\text{N}(R^2)_2$ (where $R^2$ is H or $C_{1-12}$ alkyl);

$R^1$, which may be identical or different, is $C_{1-12}$ alkyl, alkenyl, alkynyl, aryl, arylalkyl, alkylaryl, arylalkenyl, alkenylaryl, arylalkynyl, alkynylaryl, halogen, substituted amino, amide, aldehyde, keto, alkylcarbonyl, carboxy, mercapto, cyano, hydroxy, $C_{1-12}$ alkoxy, $C_{1-12}$ alkoxycarbonyl, sulfonate, phosphate, acryloxy, methacryloxy, epoxy, or vinyl;

oxygen or $-\text{NR}^2$ (where $R^2$ is H or $C_{1-12}$ alkyl) may be inserted between $R^1$ and Si to give $-(R^1)_m\text{—O—Si—}X_{(4-m)}$ or $(R^1)_m\text{—NR}^2\text{—Si—}X_{(4-m)}$; and m is an integer of 1-3.

The organic silane may be selected from the group consisting of methyltrimethoxysilane, methyltriethoxysilane, phenyltrimethoxysilane, phenyltriethoxysilane, dimethyldimethoxysilane, dimethyldiethoxysilane, diphenyldimethoxysilane, diphenyldiethoxysilane, phenyldimethoxysilane, phenyldiethoxysilane, methyldimethoxysilane, methyldiethoxysilane, phenylmethyldimethoxysilane, phenylmethyldiethoxysilane, trimethylmethoxysilane, trimethylethoxysilane, triphenylmethoxysilane, triphenylethoxysilane, phenyldimethylmethoxysilane, phenyldimethylethoxysilane, diphenylmethylmethoxysilane, diphenylmethylethoxysilane, dimethylethoxysilane, dimethylethoxysilane, diphenylmethoxysilane, diphenylethoxysilane, 3-aminopropyltriethoxysilane, 3-glycidoxypropyltrimethoxysilane, p-aminophenylsilane, allyltrimethoxysilane, N-(2-aminoethyl)-3-aminopropyltrimethoxysilane, 3-aminopropyltriethoxysilane, 3-aminopropyltrimethoxysilane, 3-glycidoxypropyldiisopropylethoxysilane, (3-glycidoxypropyl)methyldiethoxysilane, 3-glycidoxypropyltrimethoxysilane, 3-mercaptopropyltrimethoxysilane, 3-mercaptopropyltriethoxysilane, 3-methacryloxypropylmethyldiethoxysilane, 3-methacryloxypropylmethyldimethoxysilane, 3-methacryloxypropyltrimethoxysilane, n-phenylaminopropyltrimethoxysilane, vinylmethyldiethoxysilane, vinyltriethoxysilane, vinyltrimethoxysilane, and a mixture thereof.

The metal alkoxide may be at least one selected from the group consisting of compounds represented by Chemical Formula 2 below.

$$\text{M-}(R^3)_z \tag{2}$$

where M is a metal selected from the group consisting of aluminum, zirconium, and titanium;

$R^3$, which may be identical or different, is halogen, $C_{1-12}$ alkyl, alkoxy, acyloxy, or hydroxy; and Z is an integer of 3 or 4.

The filler may be at least one material selected from the group consisting of metal, glass powder, diamond powder, silicon oxide ($SiO_x$, where x is an integer of 2-4) and clay. Examples of the filler are metal, glass powder, diamond powder, silicon oxide, clay (bentonite, smectite, kaolin, etc.), calcium phosphate, magnesium phosphate, barium sulfate, aluminum fluoride, calcium silicate, magnesium silicate, barium silicate, barium carbonate, barium hydroxide, aluminum silicate, and a mixture thereof.

The solvent may be any one commonly used for partial hydrolysis, and preferably distillation water. The catalyst is also not particularly limited, and is preferably used aluminum butoxide, and zirconium propoxide etc.

The amount of filler, the solvent and the catalyst is not particularly limited because of adding according to a necessary.

In the buffer composition, an amount of the organic silane is preferably comprised at 20-99.99 wt %, more preferably at 50-99 wt %, and most preferably at 70-99 wt %. The amount of the metal alkoxide may be comprised at 0.01-80 wt %, more preferably at less than 70 wt %, and most preferably at less than 20 wt %.

In the present invention, a surface flatness of the first organic-inorganic hybrid buffer layer, Ra (average of roughness) is very important. If the buffer layer does not have sufficient flatness, defects occur when deposition of the gas barrier layer occurs, and the gas barrier property eventually disappears. Therefore, the smaller the flatness value, the greater the barrier property is increased. The first organic-inorganic hybrid buffer layer preferably has a surface flatness of about 1 nm, more preferably no more than 1 nm. The preferred embodiments of the invention may have a surface flatness (Ra value) of 0.5~1.2.

When inorganic gas barrier layer 120a, 120b is formed on the resultant buffer layer, adhesion of the inorganic material layer to the organic-inorganic hybrid buffer layer and gas barrier properties are improved. Also, because the inorganic material layer has a high modulus and a small coefficient of linear expansion, mechanical properties of the substrate can be improved.

Because the plastic film has transmission rate of oxygen and water vapor of the order of several tens to several thousands, the gas barrier layer can be prepared by deposition coating a dense, transparent inorganic material, or a thin metal film having a thickness of several nanometers on a polymer film, physically or chemically, in order to block oxygen and water vapor. When a transparent inorganic oxide film is used, it is difficult to block oxygen and water vapor efficiently if pin holes or cracks exist. Also, it is difficult to obtain a uniform thin metal film having a thickness of several nanometers and to obtain visible light transparency exceeding 80%. The resultant gas barrier layer has a thickness of 5-1,000 nm, preferably 20-500 nm, and more preferably 50-200 nm.

The inorganic material may be a metal oxide or a metal nitride of least one selected from the group consisting of $SiO_x$ (where x is an integer of 1-4), $SiO_xN_y$ (where each of x and y is an integer of 1-3), $Al_2O_3$, and ITO. The deposition coating may be performed by sputtering, chemical deposition, ion plating, plasma chemical deposition, a sol-gel method, etc.

Second organic-inorganic hybrid buffer layer 125a, 125b formed on the gas barrier layer minimizes cracking of the barrier layer and offers chemical resistance and scratch resistance to the surface. It may further contribute to improvement of gas barrier properties through hydration of the hydroxyl groups of the inorganic material layer with the hydroxyl groups of the buffer layer at the deformed portion in which pin holes or cracks exist. The composition used for the second organic-inorganic hybrid buffer layer stacked on the gas barrier layers is identical to that used for the first organic-inorganic hybrid buffer layer coated on the plastic film. However, the proportion of the organic silane, the metal alkoxide, and the filler and the coating thickness may be different.

Second organic-inorganic hybrid buffer layer 125a, 125b may be formed by coating a sol-state solution on a polymer film by spin coating, roll coating, bar coating, dip coating, gravure coating, spray coating, etc., and curing it by thermal curing, UV curing, IR curing, or high frequency heat treatment, as for the first organic-inorganic hybrid buffer layer. After curing, the buffer layer has a thickness of 0.5-20 microns (μm), preferably 2-10 μm, and more preferably 1-5 μm.

In the present invention, the surface flatness of the second organic-inorganic buffer layer is also an important. The devices such as ITO used in the LCD or OLED process is deposited on the second organic-inorganic buffer layer directly, and thus if the flatness is a high, the devices can not an essential the function due to the concentration phenomenon of an electric current.

Current trend is that OLED as the next generation displays than LCD demands more superior flatness. Thus, the second organic-inorganic hybrid buffer layer preferably also has a surface flatness of about 1 nm, more preferably no more than 1 nm. The preferred embodiments of the invention may have a surface flatness (Ra) of 0.5~1.2.

Each of the multi-layer plastic films may be attached using an acrylic adhesive or hot melt method, although it is not limited to them. When an adhesive is used, its content is not particularly limited, but preferably, the thickness of the attaching layer is 0.1-10 microns (μm).

As mentioned above, the plastic substrate of the present invention has a coefficient of linear expansion that is very small (to a maximum of 6.5 ppm/K), and the gas barrier property is superior because the water vapor transmission rate is less than 0.005 g/m2/day. Therefore, the plastic substrate of the present invention can be substituted for a glass substrate which is breakable and heavy that is currently used in display devices etc. of the related art. In addition, the plastic substrates of the present invention can be used as a material for which superior gas barrier properties are demanded, in addition to the display devices.

Hereinafter, the present invention is described in more detail through examples. However, the following examples are only for the understanding of the present invention and the present invention is not limited to or by them.

EXAMPLES

Example 1

A PET (polyethylene terephthalate, SH38, SK of Korea) film having a thickness of 100 microns, which had been acryl primer coated on both sides by biaxial drawing extrusion, was heat treated in a convection oven of 150° C. for 1 minute to remove residual stress. The resultant film was used for plastic films.

In order to form a first organic-inorganic hybrid buffer layer, 80.0 parts by weight of distilled water was added to a mixture comprising 32.5 parts by weight of tetraethoxysilane, 64.0 parts by weight of 3-glycidoxypropyltrimethoxysilane, 0.5 parts by weight of aminopropyltrimethoxysilane, 2.0 parts by weight of aluminum butoxide and 1.0 part by weight of zirconium propoxide. Partial hydrolysis was performed at 25° C. for 24 hours to prepare a buffer composition in the sol state. The buffer composition was bar coated on one side of the PET film. Gelation was performed in a convection oven of 125° C. for 1 hour after drying the film at 50° C. for 3 minutes to remove the solvent. After gelation, thickness of the organic-inorganic hybrid buffer layer was measured using an alpha stepper. The thickness was 3 microns. A thin silicon oxide ($SiO_x$, x=integer of 1-4) film was deposited on the buffer layer by impregnating 50 sccm of Ar gas using a DC/RF magnetron sputter of A-tech System and performing deposition at a pressure of 5 mtorr for 10 minutes with an RF (13.56 MHz) power of 1,000 watts. When the silicon oxide film was observed by SEM, it had a thickness of 100 nm. The above buffer composition was bar coated on the silicon oxide film. Gelation was performed in a convection oven of 125° C. for 1 hour after drying the film at 50° C. for 3 minutes to remove the solvent to form a second organic-inorganic hybrid buffer layer. As a result, a multi-layer film was obtained (100b in FIGS. 1 and 2). After gelation, thickness of the organic-inorganic hybrid buffer layer was measured using an alpha stepper. The thickness was 3 microns.

Surface roughness of the second organic-inorganic hybrid buffer layer measured by AFM room-temperature tapping mode was no more than 0.4 nm at an area of 50 microns×50 microns.

Another multi-layer film (100a in FIGS. 1 and 2) was prepared following the same process.

An adhesive composition comprising a polyfunctional acrylate oligomer as a main constituent was bar coated on the non-coated PET surface of the multi-layer film (100b). It was attached with the multi-layer film (100b). UV was illuminated for 6 minutes using DYMAX 2000-EC to cure the adhesive composition. Resultantly, a plastic substrate having a structure of 100 in FIG. 1 was obtained.

Major properties required for a display device, such as transparency, haziness, oxygen transmission rate, water vapor transmission rate, coefficient of thermal expansion, and pencil scratch hardness of the plastic substrate were measured. The results are shown in Table 1 below. Measurements were performed as follows for all Examples and Comparative Examples.

1) Transparency: Measured in the visible region of 380-780 nm using a UV spectrometer of Varian according to ASTM D1003.

2) Haze: Measured using a haze meter TC-H3DPK of Tokyo Denshoku according to ASTM D1003.

3) Oxygen transmission rate: Measured at room temperature and RH 0% using OX-TRAN 2/20 of Mocon according to ASTM D 3985.

4) Water vapor transmission rate: Measured at room temperature and RH 100% for 48 hours using PERMATRAN-W-3/33 according to ASTM F 1249.

5) Coefficient of thermal expansion: Measured using a thermo-mechanical analyzer (TMA) under a stress of 5 gf while increasing temperature by 10° C. according to ASTM D696.

6) Pencil scratch hardness: Measured under a load of 200 g according to ASTM D3363.

All the properties were measured at least five times and then averaged.

For reference, the PET film used in Example 1 had an oxygen transmission rate of 25 cc/m2/day/atm, a water vapor transmission rate of 4.5 g/m2/day, and a coefficient of thermal expansion of 22.4 ppm/K.

TABLE 1

| | Oxygen transmission rate[a] ($cc/m^2$/day/atm) | Water vapor transmission rate[b] ($g/m^2$/day/atm) | Coefficient of thermal expansion (ppm/K) | Transparency (400 nm) | Haze (%) | Pencil scratch hardness |
|---|---|---|---|---|---|---|
| Example 1 | <0.05 Immeasurable | <0.005 Immeasurable | 3.4 | >85% | <0.3 | >3H |

[a] Measurable limit: 0.05 $cc/m^2$/day/atm
[b] Measurable limit: 0.005 $g/m^2$/day When the plastic substrate prepared in Example 1 was placed on a flat surface, no bends were observed. Thus, as shown in the table 1, the plastic substrate had superior gas barrier properties, a small coefficient of thermal expansion, and good dimensional stability.

Example 2

A kapton polyimide film of DuPont having a thickness of 50 microns was surface-treated with corona (A-Sung). A sol-state buffer composition the same as that used in Example 1 was bar coated on the film. Gelation was performed in a convection oven of 200° C. for 30 minutes after drying the film at 50° C. for 3 minutes to remove the solvent. After gelation, thickness of the buffer coating layer was measured using an alpha stepper. The thickness was 2 microns. A thin silicon oxide film was deposited on the buffer coating layer in the same manner of Example 1. The above buffer composition was bar coated on the silicon oxide film. Gelation was performed in a convection oven of 200° C. for 30 minutes after drying the film at 50° C. for 3 minutes to remove the solvent to form a second buffer coating layer. Thickness of the second buffer coating layer measured with an alpha stepper was 2 microns. The resultant multi-layer film was attached with another multi-layer film, which was prepared in the same manner as in Example 1 to prepare a plastic substrate having the structure of 100 in FIG. 1.

Properties of the plastic substrate were measured as in Example 1. The results are given in Table 2 below.

alpha stepper. The thickness was 2 microns. A thin silicon oxide layer was deposited on the buffer coating layer in the same manner of Example 1. The above buffer composition was bar coated on the silicon oxide film. Gelation was performed in a convection oven of 125° C. for 1 hour after drying the film at 50° C. for 3 minutes to remove the solvent to form a second buffer coating layer. Thickness of the second buffer coating layer measured with an alpha stepper was 2 microns. The resultant multi-layer film was attached with another multi-layer film, which was prepared in the same manner as in Example 1 to prepare a plastic substrate having the structure of 100 in FIG. 1.

Properties of the plastic substrate were measured as in Example 1. The results are given in Table 2 below.

TABLE 2

| | Oxygen transmission rate (cc/m$^2$/day/atm) | Water vapor transmission rate (g/m$^2$/day/atm) | Coefficient of thermal expansion (ppm/K) | Transparency (400 nm) | Haze (%) | Pencil scratch hardness |
|---|---|---|---|---|---|---|
| Example 2 | <0.05 | <0.005 | 6.5 | >85% | <0.3 | >3H |

Example 3

The material used 40.0 parts by weight of tetraethoxysilane, 56.5 parts by weight of 3-glycidoxypropyltrimethoxysilane, 0.5 parts by weight of aminopropyltrimethoxysilane, 2.0 parts by weight of aluminum butoxide, and 1.0 parts by weight of zirconium propoxide to form the first organic-inorganic hybrid buffer layer on the plastic film(PET) in the same manner of Example 1. To buffer composition of sol state was prepared by adding 60.0 parts by weight of distillation water in the materials mixture, and then by the partial hydrolysis reaction at 25° C. for 24 hours. A sol-state buffer composition the same as that used in Example 1 was bar coated on one side of the PET film. Gelation was performed in a convection oven of 125° C. for 1 hour after drying the film at 50° C. for 3 minutes to remove the solvent. After gelation, thickness of the buffer coating layer was measured using an

TABLE 3

| | Oxygen transmission rate (cc/m$^2$/day/atm) | Water vapor transmission rate (g/m$^2$/day/atm) | Coefficient of thermal expansion (ppm/K) | Transparency (400 nm) | Haze (%) | Pencil scratch hardness |
|---|---|---|---|---|---|---|
| Example 3 | <0.05 | <0.005 | 4.0 | >85% | <0.3 | >3H |

Comparative Example 1

Figure 3:
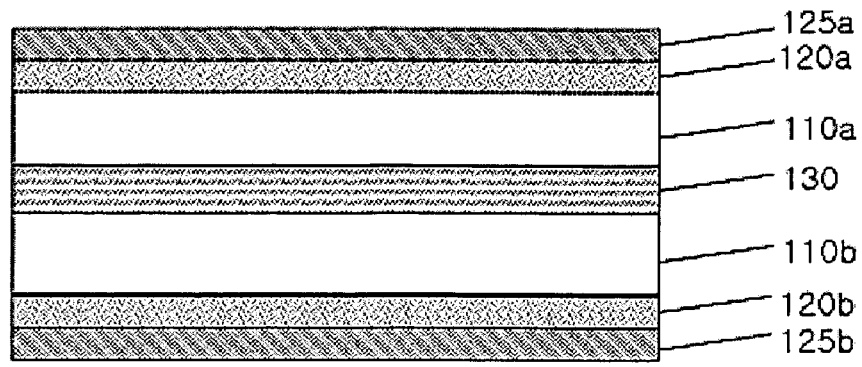
FIGS. 3 to 8 show the cross-section of the plastic substrate according to Comparative Examples 1 to 6.

A plastic substrate shown in FIG. 3 was prepared by attaching with two multi-layer films, which was prepared in the same manner of Example 1, except for coating an organic-inorganic hybrid buffer layer only on the gas barrier layer without coating it between the PET film and the silicon oxide gas barrier layer.

The buffer layer coated on the silicon oxide gas barrier layer was prepared in the same manner of Example 1. Properties of the resultant plastic substrate were measured. The results are given in Table 4 below.

TABLE 4

| | Oxygen transmission rate (cc/m$^2$/day/atm) | Water vapor transmission rate (g/m$^2$/day/atm) | Coefficient of thermal expansion (ppm/K) | Transparancy (400 nm) | Haze (%) |
|---|---|---|---|---|---|
| Comparative Example 1 | <0.05 | <0.005 | 22.0 | >85% | <0.3 |

As seen in Table 4, the plastic substrate prepared in Comparative Example 1 showed oxygen and water vapor transmission rate exceeding the measuring limit. It also showed a large coefficient of linear expansion, which is comparable to 22.4, or the coefficient of thermal expansion of the PET substrate itself because of comprising only one buffer layer.

Comparative Example 2

Figure 4:
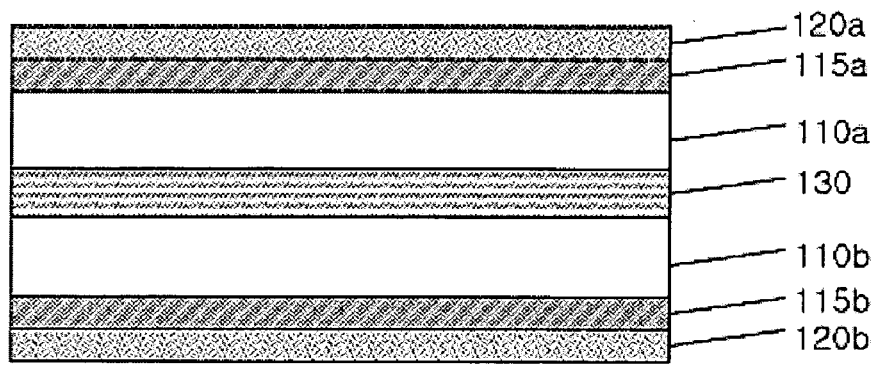

A plastic substrate shown in FIG. 4 was prepared by attaching with two multi-layer films, which was prepared in the same manner of Example 1, except for coating the first organic-inorganic hybrid buffer layer on PET film and then by depositing the silicon oxide gas barrier layer without coating it the second organic-inorganic hybrid buffer layer on the barrier layer.

The buffer layer coated on the plastic film was prepared in the same manner of Example 1. Properties of the resultant plastic substrate were measured. The results are given in Table 5 below.

TABLE 5

| | Oxygen transmission rate (cc/m$^2$/day/atm) | Water vapor transmission rate (g/m$^2$/day/atm) | Coefficient of thermal expansion (ppm/K) | Transparancy (400 nm) | Haze (%) |
|---|---|---|---|---|---|
| Comparative Example 2 | <0.05 | <0.005 | 22.2 | >85% | <0.3 |

As seen in Table 5, the plastic substrate prepared in Comparative Example 2 showed oxygen and water vapor transmission rate exceeding the measuring limit. It also showed a large coefficient of thermal expansion, which is comparable to 22.4, or the coefficient of thermal expansion of the PET substrate itself because of comprising only one buffer layer.

Comparative Example 3

Figure 5:
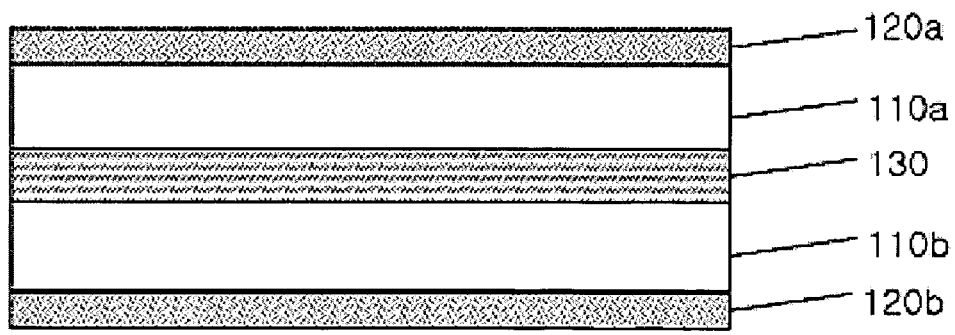

A plastic substrate shown in FIG. 5 was prepared by attaching with two multi-layer films, which was prepared in the same manner of Example 1, except for depositing the silicon oxide gas barrier layer on PET film without coating the first organic-inorganic hybrid buffer layer and the second organic-inorganic hybrid buffer layer.

Properties of the resultant plastic substrate were measured. The results are given in Table 6 below.

TABLE 6

| | Oxygen transmission rate (cc/m$^2$/day/atm) | Water vapor transmission rate (g/m$^2$/day/atm) | Coefficient of thermal expansion (ppm/K) | Transparancy (400 nm) | Haze (%) |
|---|---|---|---|---|---|
| Comparative Example 3 | 1.1 | 2.0 | 22.1 | >85% | <0.3 |

As seen in Table 6, the plastic substrate prepared in Comparative Example 3 showed oxygen transmission rate of 1.1 and water vapor transmission rate of 2.0. This value was decreased more than PET film, relatively, but it shows still high value. In addition, It also showed a large coefficient of thermal expansion, which is comparable to 22.4, or the coefficient of thermal expansion of the PET substrate itself. Thus, in the case of Comparative Example 3, it is not a suitable substrate for a device.

Comparative Example 4

Figure 6:
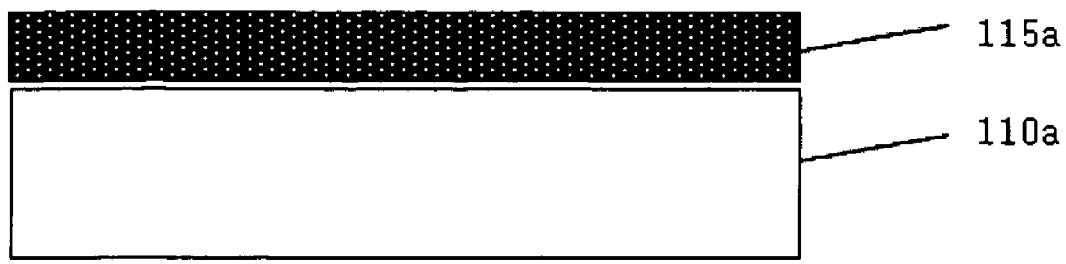

A plastic substrate shown in FIG. 6 was prepared by depositing the silicon oxide gas barrier layer only on PET film.

Properties of the resultant plastic substrate were measured. The results are given in Table 7 below.

TABLE 7

|  | Oxygen transmission rate (cc/m$^2$/day/atm) | Water vapor transmission rate (g/m$^2$/day/atm) | Coefficient of thermal expansion (ppm/K) | Transparency (400 nm) | Haze (%) |
| --- | --- | --- | --- | --- | --- |
| Comparative Example 4 | 3.1 | 3.0 | 22.0 | >85% | <0.3 |

As seen in Table 7, the plastic substrate prepared in Comparative Example 3 showed oxygen transmission rate of 3.1 and water vapor transmission rate of 3.0. This value was decreased more than PET film, relatively, but it shows still high value. In addition, it also showed a large coefficient of thermal expansion, which is comparable to 22.4, or the coefficient of thermal expansion of the PET substrate itself. Thus, in the case of Comparative Example 4, it is not a suitable substrate for a device.

Comparative Example 5

Figure 7:
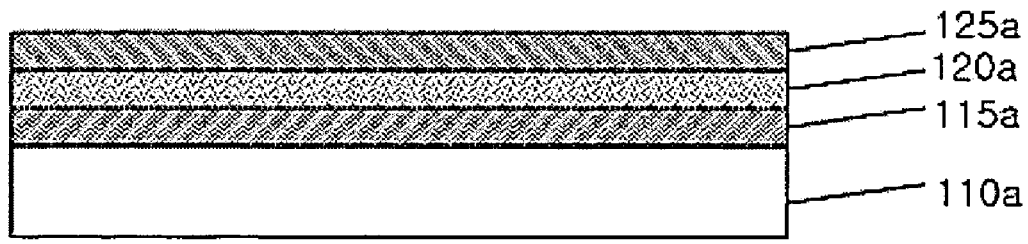

The buffer composition solution used in Example 1 was bar coated on one side of a PET film to a thickness of 2.5 microns. Crosslinking and deposition of a silicon oxide film having a thickness of about 100 nm were performed as in Example 1 to form a gas barrier layer. Buffer layer coating, crosslinking, and silicon oxide film deposition were repeated two more times. On the outermost silicon oxide film, another buffer layer was coated to a thickness of about 3 microns. After removing the remaining solvent at 50° C. for 3 minutes, crosslinking was performed at 125° C. for 1 hour to prepare a plastic substrate having non-symmetrical stacked only one side (FIG. 7). The resultant substrate measured 12 cm×12 cm. When it was placed on a flat surface, it was bent upward, so that the center region was spaced about 3 cm from the surface. Property measurement results are given in Table 4 below. While oxygen and water vapor transmission rate was superior, the coefficient of thermal expansion was not improved. Thus, in the case of Comparative Example 5, it is not a suitable substrate for a device.

TABLE 8

|  | Oxygen transmission rate (cc/m$^2$/day/atm) | Water vapor transmission rate (g/m$^2$/day/atm) | Coefficient of thermal expansion (ppm/K) | Transparency (400 nm) | Haze (%) |
| --- | --- | --- | --- | --- | --- |
| Comparative Example 2 | <0.05 | <0.005 | 22.2 | >85% | <0.3 |

Comparative Example 6

Figure 8:
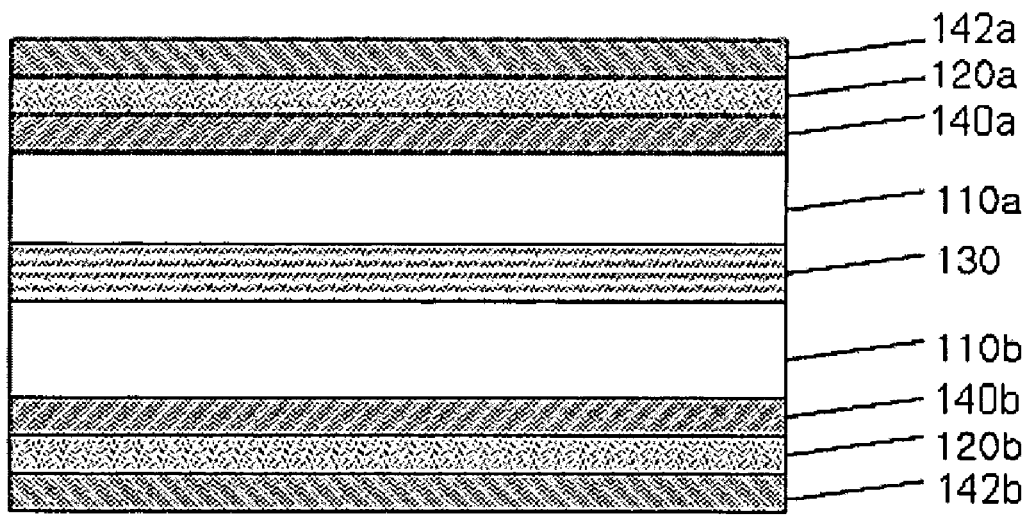

The PET film used in Example 1 was dipped in a solution containing 0.3 parts by weight of a polyfunctional methacrylate photoinitiator. Dip coating was performed by raising the film at a rate of 10 cm/min. Then, UV curing was performed to form organic crosslinked coating layers on both sides of the film. After UV curing, thickness of the crosslinked coating layers 140a, 140b measured with an alpha stepper was 3 microns. A silicon oxide film having a thickness of 100 nm was deposited on the organic crosslinked coating layers in the same manner of Example 1. Then, more organic crosslinked coating layers 142a, 142b where a plastic substrate prepared of FIG. 8 by coating on the silicon oxide barrier layers to a thickness of 3 microns to prepare a plastic substrate were produced. Property measurement results of the substrate are given in Table 9 below.

TABLE 9

|  | Oxygen transmission rate (cc/m$^2$/day/atm) | Water vapor transmission rate (g/m$^2$/day/atm) | Coefficient of thermal expansion (ppm/K) | Transparency (400 nm) | Haze (%) |
| --- | --- | --- | --- | --- | --- |
| Comparative Example 3 | 0.08 | 0.01 | 22.3 | >85% | <0.3 |

As seen in Table 9, although oxygen and water vapor transmission rate decreased significantly compared with the PET substrate, the coefficient of linear expansion did not decrease.

As apparent from the above description, the plastic substrate of the present invention has a small coefficient of linear expansion, superior gas barrier properties and excellent dimensional stability. Thus, it can replace the glass substrate used for display devices. Also, it can be utilized for packaging and container materials in applications requiring superior gas barrier properties.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A plastic substrate having a multi-layer structure, comprising:
    plastic films attached to each other, and
    a first buffering layer of an organic-inorganic hybrid, a layer of gas barrier, and a second buffering layer of an organic-inorganic hybrid which are stacked on both sides of the plastic films in an orderly manner, each layer forming a symmetrical arrangement centering around the plastic films, and the plastic film is made of a polymer-clay nanocomposite in which the clay nanocomposite is dispersed in the polymer matrix.

2. The plastic substrate of claim 1, wherein the gas barrier layer is made of at least one inorganic material selected from the group consisting of $SiO_x$ (where x is an integer of 1-4), $SiO_xN_y$ (where each of x and y is an integer of 1-3), $Al_2O_3$, and ITO.

3. The plastic substrate of claim 1, wherein the gas barrier layer has a thickness of 5-1,000 nm.

4. The plastic substrate of claim 1, wherein each of the first organic-inorganic hybrid buffer layer and the second organic-inorganic hybrid buffer layer is prepared from partial hydrolysis of a buffer composition comprising 20-99.99 wt % of at least one organic silane selected from the group consisting of the compounds represented by Chemical Formula 1 below and 0.01-80 wt % of at least one metal alkoxide selected from the group consisting of the compounds represented by Chemical Formula 2:

$$(R^1)_m-Si-X_{(4-m)} \tag{1}$$

where X, which may be identical or different, is hydrogen, halogen, $C_{1-12}$ alkoxy, acyloxy, alkycarbonyl, alkoxycarbonyl, or $-N(R^2)_2$ (where $R^2$ is H or $C_{1-12}$ alkyl);
$R^1$, which may be identical or different, is $C_{1-12}$ alkyl, alkenyl, alkynyl, aryl, arylalkyl, alkylarl, arylalkenyl, alkenylaryl, arylalkynyl, alkynylaryl, halogen, substituted amino, amide, aldehyde, keto, alkylcarbonyl, carboxy, mercapto, cyano, hydroxy, $C_{1-12}$ alkoxy, $C_{1-12}$ alkoxycarbonyl, sulfonate, phosphate, acryloxy, methacryloxy, epoxy, or vinyl;
oxygen or $-NR^2$ (where $R^2$ is H or $C_{1-12}$ alkyl) may be inserted between $R^1$ and Si to give $-(R^1)_m-O-Si-X_{(4-m)}$ or $(R^1)_m-NR^2-Si-X_{(4-m)}$; and
m is an integer of 1-3; and $$M-(R^3)_z \tag{2}$$

where M is a metal selected from the group consisting of aluminum, zirconium, and titanium;
$R^3$, which may be identical or different, is halogen, $C_{1-12}$ alkyl, alkoxy, acyloxy, or hydroxy; and
Z is an integer of 3 or 4.

5. The plastic substrate of claim 4, wherein the buffer composition further comprises at least one filler selected from the group consisting of metal, glass powder, diamond powder, silicon oxide, clay, calcium phosphate, magnesium phosphate, barium sulfate, aluminum fluoride, calcium silicate, magnesium silicate, barium silicate, barium carbonate, barium hydroxide, and aluminum silicate; a solvent; and a polymerization catalyst.

6. The plastic substrate of claim 1, wherein each of the first organic-inorganic hybrid buffer layer and the second organic-inorganic hybrid buffer layer has a thickness of 0.5-20 microns (μm).

* * * * *